United States Patent
Wang et al.

(10) Patent No.: US 12,359,301 B2
(45) Date of Patent: **\*Jul. 15, 2025**

(54) PIXEL ARRANGEMENT, MANUFACTURING METHOD THEREOF, DISPLAY PANEL, DISPLAY DEVICE AND MASK

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yang Wang, Beijing (CN); Yangpeng Wang, Beijing (CN); Benlian Wang, Beijing (CN); Haijun Yin, Beijing (CN); Haijun Qiu, Beijing (CN); Yao Hu, Beijing (CN); Weinan Dai, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( \* ) Notice: Subject to any disclaimer, the term of this patent is extended or adjusted under 35 U.S.C. 154(b) by 465 days.

This patent is subject to a terminal disclaimer.

(21) Appl. No.: 17/726,842

(22) Filed: Apr. 22, 2022

(65) Prior Publication Data
US 2022/0246692 A1    Aug. 4, 2022

Related U.S. Application Data

(63) Continuation of application No. 16/473,281, filed as application No. PCT/CN2018/122022 on Dec. 19, 2018, now Pat. No. 11,342,384.

(30) Foreign Application Priority Data

Jan. 2, 2018 (CN) .......................... 201810002806.2

(51) Int. Cl.
*H10K 59/35* (2023.01)
*C23C 14/04* (2006.01)
(Continued)

(52) U.S. Cl.
CPC ............ *C23C 14/12* (2013.01); *C23C 14/042* (2013.01); *C23C 14/24* (2013.01); *H10K 59/352* (2023.02);
(Continued)

(58) Field of Classification Search
None
See application file for complete search history.

(56) References Cited

U.S. PATENT DOCUMENTS 10,991,768 B2    4/2021 Li et al.
11,342,384 B2 *  5/2022 Wang .................... H10K 59/352
(Continued)

FOREIGN PATENT DOCUMENTS

CN    103311266 A    9/2013
CN    103681754 A    3/2014
(Continued)

OTHER PUBLICATIONS

Notice of Allowance from U.S. Appl. No. 16/473,281 dated Jan. 19, 2022.
(Continued)

*Primary Examiner* — Telly D Green
(74) *Attorney, Agent, or Firm* — Calfee, Halter & Griswold LLP

(57) ABSTRACT

A pixel arrangement including: first groups of sub-pixels arranged in a first direction, each of the first groups including first sub-pixels and third sub-pixels arranged alternately; and second groups of sub-pixels arranged in the first direction, each of the second groups including third sub-pixels and second sub-pixels arranged alternately. The first groups
(Continued)

and the second groups are alternately arranged in a second direction perpendicular to the first direction. The first groups and the second groups are arranged to form third groups of sub-pixels arranged in the second direction and fourth groups of sub-pixels arranged in the second direction. The third groups and the fourth groups are alternately arranged in the first direction. Each of the third groups includes first sub-pixels and third sub-pixels arranged alternately. Each of the fourth groups includes third sub-pixels and second sub-pixels arranged alternately.

19 Claims, 12 Drawing Sheets

(51) Int. Cl.
  *C23C 14/12* (2006.01)
  *C23C 14/24* (2006.01)
  *H10K 71/00* (2023.01)
  *H10K 71/16* (2023.01)

(52) U.S. Cl.
  CPC .......... *H10K 59/353* (2023.02); *H10K 71/00* (2023.02); *H10K 71/164* (2023.02); *H10K 71/166* (2023.02)

(56) References Cited

U.S. PATENT DOCUMENTS

| | | | |
|---|---|---|---|
| 2013/0057463 A1* | 3/2013 | Zhang | ............ G02F 1/167 345/107 |
| 2013/0234917 A1 | 9/2013 | Lee | |
| 2014/0003045 A1 | 1/2014 | Lee et al. | |
| 2014/0300589 A1* | 10/2014 | Tanaka | ............ G06F 3/03542 349/12 |
| 2015/0109268 A1 | 4/2015 | Huang et al. | |
| 2015/0162391 A1 | 6/2015 | Kim | |
| 2016/0240592 A1 | 8/2016 | Li et al. | |
| 2016/0253943 A1 | 9/2016 | Wang | |
| 2016/0351116 A1 | 12/2016 | Sun | |
| 2017/0287988 A1 | 10/2017 | Lee et al. | |
| 2017/0294491 A1 | 10/2017 | Jo et al. | |
| 2017/0309688 A1 | 10/2017 | Lee et al. | |
| 2017/0352710 A1 | 12/2017 | Hong et al. | |
| 2018/0357953 A1 | 12/2018 | Hu | |
| 2018/0366052 A1 | 12/2018 | Shi | |
| 2019/0035861 A1 | 1/2019 | Wang et al. | |
| 2021/0027691 A1 | 1/2021 | Hu et al. | |

FOREIGN PATENT DOCUMENTS

| | | |
|---|---|---|
| CN | 103941490 A | 7/2014 |
| CN | 104282727 A | 1/2015 |
| CN | 104466007 A | 3/2015 |
| CN | 104576695 A | 4/2015 |
| CN | 104637987 A | 5/2015 |
| CN | 104701341 A | 6/2015 |
| CN | 105826349 A | 8/2016 |
| CN | 106298851 A | 1/2017 |
| CN | 106298855 A | 1/2017 |
| CN | 106486513 A | 3/2017 |
| CN | 106816449 A | 6/2017 |
| CN | 106920832 A | 7/2017 |
| CN | 107248378 A | 10/2017 |
| CN | 107275359 A | 10/2017 |
| CN | 107275360 A | 10/2017 |
| CN | 107305905 A | 10/2017 |
| CN | 207966985 U | 10/2018 |
| CN | 207966994 U | 10/2018 |
| CN | 207966995 U | 10/2018 |
| EP | 2709155 A1 | 3/2014 |
| KR | 20170116598 A | 10/2017 |
| WO | WO-2013007196 A1 * | 1/2013 ....... G02F 1/134309 |

OTHER PUBLICATIONS

Office action from U.S. Appl. No. 16/473,281 dated Oct. 29, 2021.
Office action from Chinese Application No. 201820003548.5 dated Jun. 19, 2018.
Office action from Chinese Application No. 201820003576.7 dated Jun. 19, 2018.
Notice of Grant from Chinese Application No. 201820003576.7 dated Sep. 4, 2018.
Office action from Chinese Application No. 201820003815.9 dated Jun. 19, 2018.
Office action from Chinese Application No. 201820235510.0 dated Jul. 20, 2018.
Office action from Chinese Application No. 201820241941.8 dated Jul. 23, 2018.
International Search Report and Written Opinion from PCT/CN2018/122021 dated Feb. 27, 2019.
International Search Report and Written Opinion from PCT/CN2018/122022 dated Mar. 26, 2019.
International Search Report and Written Opinion from PCT/CN2018/122063 dated Mar. 18, 2019.
International Search Report and Written Opinion from PCT/CN2018/122205 dated Feb. 27, 2019.
International Search Report and Written Opinion from PCT/CN2018/122206 dated Mar. 25, 2019.
Office action from Chinese Application No. 201810002806.2 dated Apr. 26, 2024.
Office action from Chinese Application No. 201810002806.2 dated Feb. 23, 2024.

* cited by examiner

PIXEL ARRANGEMENT, MANUFACTURING METHOD THEREOF, DISPLAY PANEL, DISPLAY DEVICE AND MASK

RELATED REFERENCES

The present application is a continuation application of U.S. patent application Ser. No. 16/473,281, filed on Jun. 25, 2019, which is the national stage entry of PCT/CN2018/122022, filed on Dec. 19, 2018, which claims priority to Chinese Application No. 201810002806.2, filed on Jan. 2, 2018, the entire contents of which are all hereby incorporated by reference.

TECHNICAL FIELD

The present disclosure relates to the field of display technologies, and in particular, to a pixel arrangement, a method of manufacturing the pixel arrangement, a display panel, a display device, and a mask.

BACKGROUND

Compared with liquid crystal displays (LCDs), organic electroluminescent (OLED) displays have advantages such as low energy consumption, low production cost, self-illumination, wide view angle and fast responsiveness. OLED display devices have recently begun to replace traditional liquid crystal displays in the field of flat panel display such as mobile phones, PDAs, and digital cameras.

An OLED display typically includes a base substrate and sub-pixels arranged in a matrix on the base substrate. The sub-pixels are generally formed by evaporating organic light-emitting materials on an array substrate using a fine metal mask (FMM).

SUMMARY

According to some embodiments of the present disclosure, a pixel arrangement is provided, comprising: a plurality of first groups of sub-pixels arranged in a first direction, each of the plurality of first groups comprising a plurality of first sub-pixels and a plurality of third sub-pixels arranged alternately; and a plurality of second groups of sub-pixels arranged in the first direction, each of the plurality of second groups comprising a plurality of third sub-pixels and a plurality of second sub-pixels arranged alternately. The plurality of first groups and the plurality of second groups are alternately arranged in a second direction perpendicular to the first direction. The plurality of first groups and the plurality of second groups are arranged to form a plurality of third groups of sub-pixels arranged in the second direction and a plurality of fourth groups of sub-pixels arranged in the second direction, the plurality of third groups and the plurality of fourth groups are alternately arranged in the first direction, each of the plurality of third groups comprises a plurality of first sub-pixels and a plurality of third sub-pixels arranged alternately, and each of the plurality of fourth groups comprises a plurality of third sub-pixels and a plurality of second sub-pixels arranged alternately.

In some embodiments, each of the third sub-pixels is asymmetrical with respect to at least one of the first direction or the second direction.

In some embodiments, each third sub-pixel of the third sub-pixels has a substantially axisymmetric shape and is asymmetrical with respect to a direction perpendicular to an axis of symmetry of the third subpixel.

In some embodiments, each of the third sub-pixels is substantially symmetrical with respect to one of the first direction and the second direction and is asymmetrical with respect to another one of the first direction and the second direction.

In some embodiments, each of the third sub-pixels has a strip shape.

In some embodiments, the third sub-pixels in each of the plurality of first groups each extend along the first direction, and the third sub-pixels in each of the plurality of second groups each extend along the second direction.

In some embodiments, each of the third sub-pixels has two ends of different outlines.

In some embodiments, one of the two ends has a circular arc-shaped outline and another one of the two ends has an outline formed by at least one straight line.

In some embodiments, each two directly adjacent ones of the plurality of third sub-pixels in each of the plurality of first groups have respective orientations substantially opposite to each other.

In some embodiments, each two directly adjacent ones of the plurality of third sub-pixels in each of the plurality of third groups have respective orientations substantially opposite to each other.

In some embodiments, the plurality of third sub-pixels in each of the plurality of first groups have substantially a same orientation.

In some embodiments, the plurality of third sub-pixels in each of the plurality of third groups have substantially a same orientation.

In some embodiments, each of the third sub-pixels in the plurality of first groups of sub-pixels has a side opposite and substantially parallel to a side of a directly adjacent one of the first sub-pixels in the first direction. Each of the third sub-pixels in the plurality of second groups of sub-pixels has a side opposite and substantially parallel to a side of a directly adjacent one of the second sub-pixels in the first direction. Each of the third sub-pixels in the plurality of third groups of sub-pixels has a side opposite and substantially parallel to a side of a directly adjacent one of the first sub-pixels in the second direction. Each of the third sub-pixels in the plurality of fourth groups of sub-pixels has a side opposite and substantially parallel to a side of a directly adjacent one of the second sub-pixels in the second direction.

In some embodiments, each of first ones of the first sub-pixels has four edges respectively opposite to four corresponding ones, directly adjacent thereto in the first direction and the second direction, of the third sub-pixels, and each edge of the four edges has a respective outline that matches an outline of an end, opposite to the edge, of a respective one of the four corresponding ones of the third sub-pixels.

In some embodiments, each of the first sub-pixels and the third sub-pixels has no internal angle of less than 90 degrees.

In some embodiments, the first sub-pixels, the second sub-pixels, and the third sub-pixels are arranged substantially equidistantly with respect to each other.

In some embodiments, the third sub-pixels are arranged substantially equidistantly with respect to each other, and the first sub-pixels and the second sub-pixels are arranged substantially equidistantly with respect to each other.

In some embodiments, the first sub-pixels are red pixels, the second sub-pixels are blue pixels, and the third sub-pixels are green pixels.

In some embodiments, the first sub-pixels are blue pixels, the second sub-pixels are red pixels, and the third sub-pixels are green pixels.

In some embodiments, the blue sub-pixels each have a first area, the red sub-pixels each have a second area smaller than the first area, and the green sub-pixels each have a third area smaller than the second area.

In some embodiments, the blue sub-pixels each have a first area, the green sub-pixels each have a second area smaller than the first area, and the red sub-pixels each have a third area smaller than the second area.

In some embodiments, the red sub-pixels have a first total area, the green sub-pixels have a second total area, and the blue sub-pixels have a third total area, and the first total area, the second total area, and the third total area have a ratio of 1:(1.1 to 1.5):(1.2 to 1.7), further 1:(1.2 to 1.35):(1.4 to 1.55), or further 1:1.27:1.46.

In some embodiments, the red sub-pixels, the green sub-pixels and the blue sub-pixels have a ratio of approximately 1:2:1 in quantity.

In some embodiments, the third sub-pixels have substantially a same area and substantially a same shape.

In some embodiments, the first sub-pixels have substantially a same area and substantially a same shape.

In some embodiments, the second sub-pixels have substantially a same area and substantially a same shape.

According to some embodiments of the present disclosure, a display panel is provided, comprising: a display substrate; and the pixel arrangement as described above. The pixel arrangement is formed on the display substrate. The pixel arrangement is arranged such that each of the first direction and the second direction intersects a length direction of the display substrate at approximately 45 degrees.

In some embodiments, the first sub-pixels, the second sub-pixels, and the third sub-pixels are organic electroluminescent sub-pixels.

According to some embodiments of the present disclosure, a display device is provided comprising the display panel as described above.

According to some embodiments of the present disclosure, a set of masks for manufacturing the pixel arrangement as described above is provided, comprising: a first mask defining a plurality of first openings arranged to have a pattern corresponding to a pattern of the first sub-pixels; a second mask defining a plurality of second openings arranged to have a pattern corresponding to a pattern of the second sub-pixels; and a third mask defining a plurality of third openings arranged to have a pattern corresponding to a pattern of the third sub-pixels.

According to some embodiments of the present disclosure, a method of manufacturing a pixel arrangement using the set of masks as described above is provided, comprising: providing a display substrate; evaporating a first electroluminescent material and depositing the evaporated first electroluminescent material onto the display substrate to form the first sub-pixels by passing the evaporated first electroluminescent material through the plurality of first openings of the first mask; evaporating a second electroluminescent material and depositing the evaporated second electroluminescent material onto the display substrate to form the second sub-pixels by passing the evaporated second electroluminescent material through the plurality of second openings of the second mask; and evaporating a third electroluminescent material and depositing the evaporated third electroluminescent material onto the display substrate to form the third sub-pixels by passing the evaporated third electroluminescent material through the plurality of third openings of the third mask.

According to some embodiments of the present disclosure, a pixel arrangement is provided, comprising: five first sub-pixels respectively at a center and four vertices of a first imaginary rectangle; four second sub-pixels at respective centers of four sides of the first imaginary rectangle; and four third sub-pixels within respective ones of four second imaginary rectangles, each of the second imaginary rectangles defined by a respective vertex of the four vertices of the first imaginary rectangle, respective centers of two adjoining ones, which contain the respective vertex, of the four sides of the first imaginary rectangle, and the center of the first imaginary rectangle, the four second imaginary rectangles forming the first imaginary rectangle.

In some embodiments, each of the third sub-pixels is asymmetrical with respect to at least one of the first direction or the second direction.

According to some embodiments of the present disclosure, a display panel is provided, comprising: a display substrate; and a plurality of the pixel arrangements as described above that adjoin each other, wherein the pixel arrangements are formed on the display substrate. Each two directly adjacent ones of the first imaginary rectangles in a row direction have a common side, such that the sub-pixels on the common side are shared by the two directly adjacent ones of the first imaginary rectangles. Each two directly adjacent ones of the first imaginary rectangles in a column direction have a common side, such that the sub-pixels on the common side are shared by the two directly adjacent ones of the first imaginary rectangles.

According to some embodiments of the present disclosure, a pixel arrangement is provided, comprising: a plurality of first repeating units arranged in a first direction, each of the plurality of first repeating units comprising a plurality of first sub-pixels and a plurality of third sub-pixels arranged alternately; and a plurality of second repeating units arranged in the first direction, each of the plurality of second repeating units comprising a plurality of third sub-pixels and a plurality of second sub-pixels arranged alternately. The plurality of first repeating units and the plurality of second repeating units are alternately arranged in a second direction perpendicular to the first direction. The plurality of first repeating units and the plurality of second repeating units are arranged such that each of the first sub-pixels is directly adjacent to four corresponding ones of the third sub-pixels and each of the second sub-pixels is directly adjacent to four corresponding ones of the third sub-pixels.

These and other aspects of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings in which.

In the figures, different reference signs, combined by the same numeral and different letter suffixes, can be collectively referenced by the numeral.

DETAILED DESCRIPTION

Figure 1:
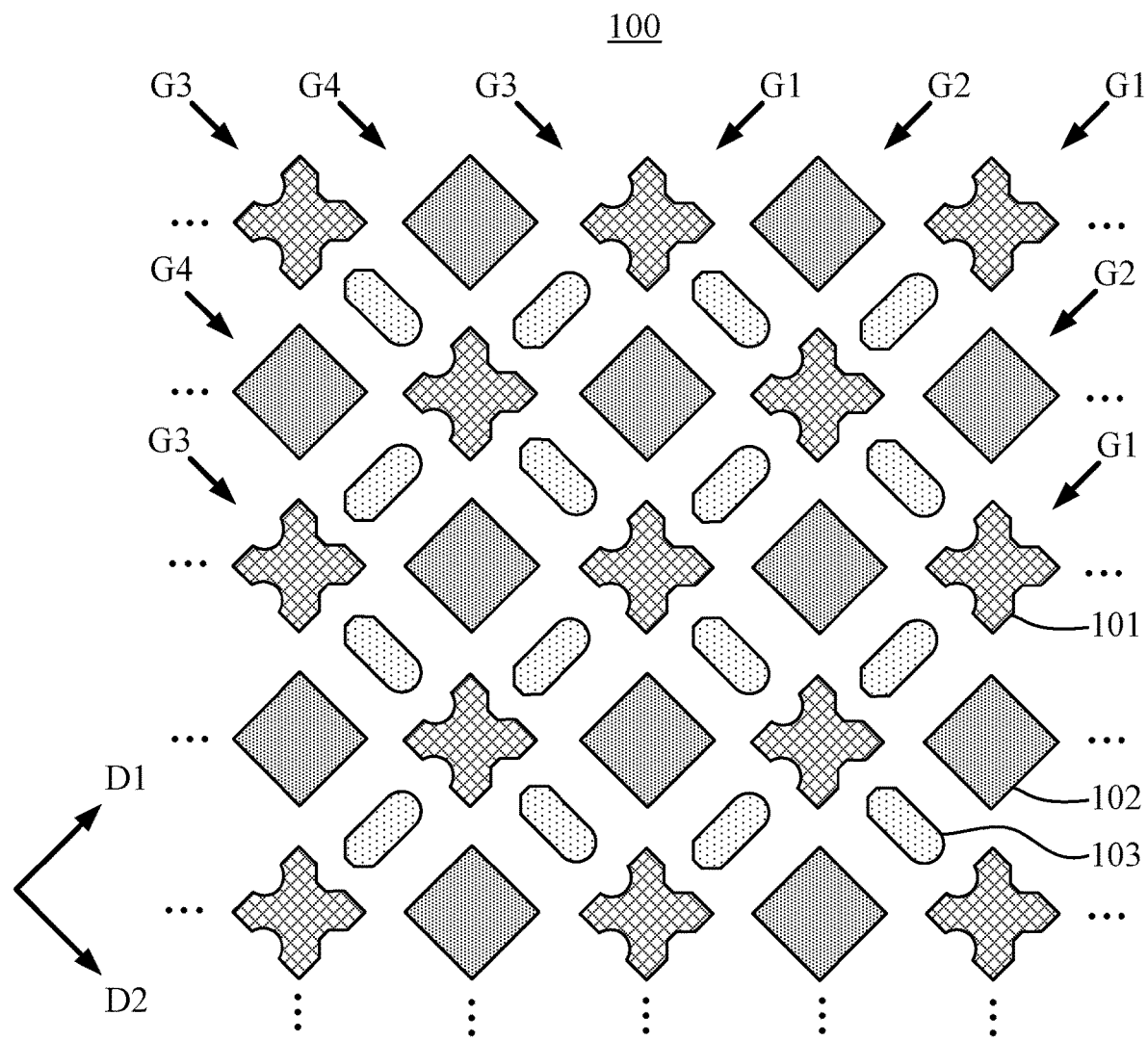
FIG. 1 is a schematic plan view of a pixel arrangement in accordance with an embodiment of the present disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the FIGURES. It will be understood that the spatially relative terms are intended to encompass different orientations of the device in use or operation in addition to the orientation depicted in the FIGURES. For example, if the device in the FIGURES is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "directly adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the FIGURES are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings.

FIG. 1 is a schematic plan view of a pixel arrangement 100 in accordance with an embodiment of the present disclosure.

As shown in FIG. 1, the pixel arrangement 100 includes a plurality of first groups of sub-pixels (also referred to as "first repeating units") G1 arranged in a first direction D1 and a second groups of sub-pixels (also referred to as "second repeating units") G2 arranged in the first direction D1. The plurality of first groups G1 and the plurality of second groups G2 are alternately arranged in a second direction D2 perpendicular to the first direction D1.

Each of the plurality of first groups G1 includes a plurality of first sub-pixels 101 and a plurality of third sub-pixels 103 that are alternately arranged. Each of the plurality of second groups G2 includes a plurality of third sub-pixels 103 and a plurality of second sub-pixels 102 that are alternately arranged. The plurality of first groups G1 and the plurality of second groups G2 are further arranged to form a plurality of third group sub-pixels G3 and a plurality of fourth group sub-pixels G4 alternately arranged in the first direction D1. Each of the plurality of third groups G3 includes a plurality of first sub-pixels 101 and a plurality of third sub-pixels 103 arranged alternately, and each of the plurality of fourth groups G4 includes a plurality of third sub-pixels 103 and a plurality of second sub-pixels 102 arranged alternately. As shown in FIG. 1, each of the first sub-pixels 101 is directly adjacent to four third sub-pixels 103, and each of the second sub-pixels 102 is also directly adjacent to four third sub-pixels 103.

In this embodiment, each of the third sub-pixels 103 is asymmetrical with respect to at least one of the first direction D1 or the second direction D2. In the example of FIG. 1, the third sub-pixels 103 in each of the first groups G1 are asymmetrical with respect to the second direction D2, and the third sub-pixels 103 in each of the second groups G2 are asymmetrical with respect to the first direction D1. Such asymmetry allows for a flexible design of the sub-pixel pattern.

Compared with the existing pixel arrangement, the pixel arrangement 100 can allow the first sub-pixels 101, the second sub-pixels 102, and the third sub-pixels 103 to be more closely arranged under the same process condition, thereby increasing as much as possible the area of each single sub-pixel. This in turn facilitates the reduction of the drive current of the display device and an increase in the lifetime of the display device.

In the example of FIG. 1, the first, second, and third sub-pixels 101, 102, and 103 are arranged substantially equidistantly with respect to each other. In some variations, the third sub-pixels 103 may be arranged differently. For example, the third sub-pixels 103 may be arranged substantially equidistantly with respect to each other, and the first sub-pixels 101 and the second sub-pixels 102 are arranged substantially equidistantly with respect to each other. It will be understood that in this document the term "substantially" used in connection with "equidistantly", "parallel", "same", "equal", "symmetric", etc., is intended to encompass variations due to the manufacturing process.

Figure 2:
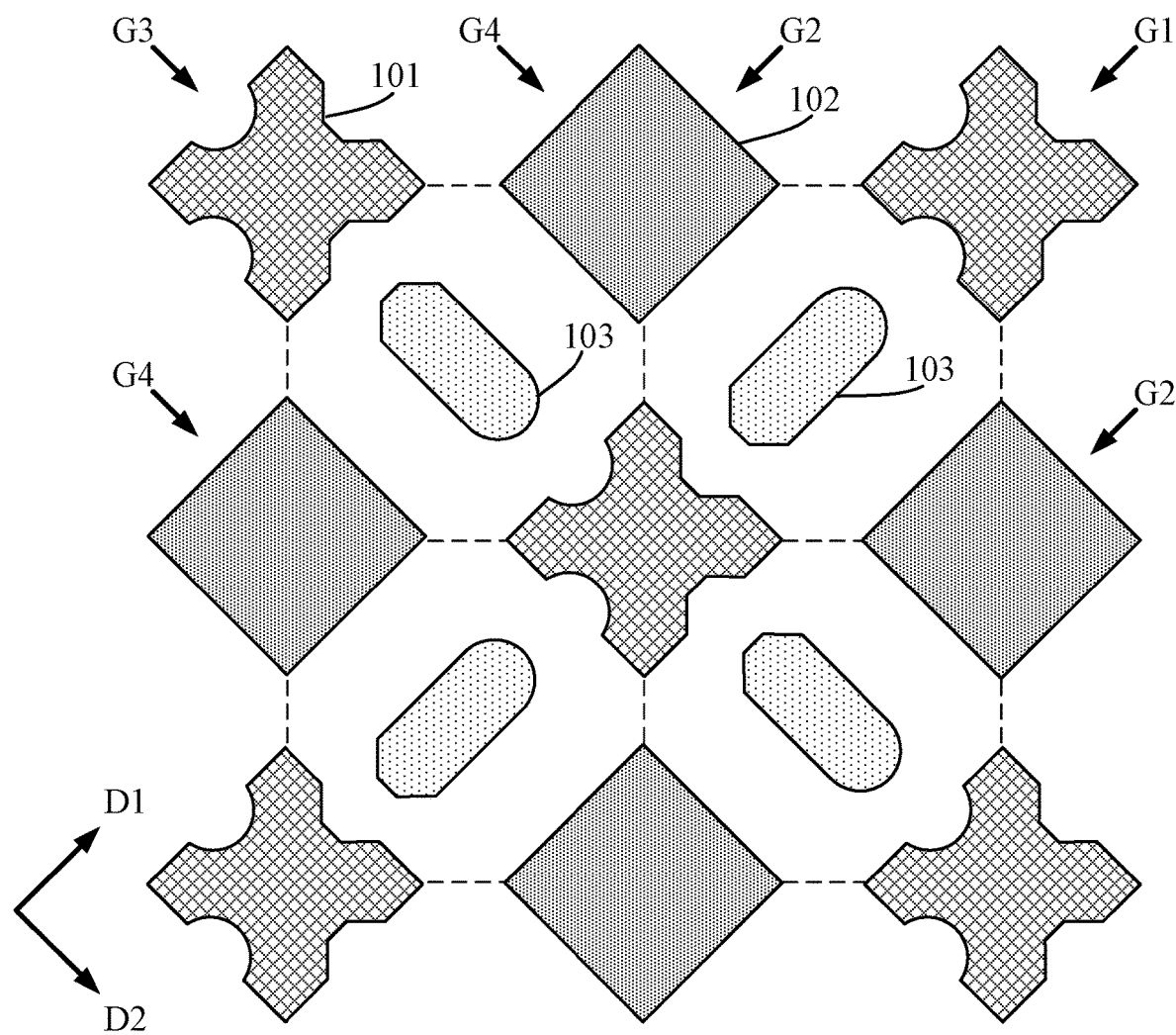
FIG. 2 is a schematic plan view of a partial area of the pixel arrangement of FIG. 1.

FIG. 2 is a schematic plan view of a partial area of the pixel arrangement 100 of FIG. 1.

As shown in FIG. 2, the third sub-pixels 103 each have a substantially axisymmetric shape. Specifically, the third sub-pixels 103 in each of the first groups G1 are substantially symmetrical with respect to the first direction D1 and asymmetric with respect to the second direction D2, i.e., they have an axis of symmetry along the first direction D1 and are asymmetrical with respect to a direction perpendicular to that axis of symmetry. The third sub-pixels 103 in each of the second groups G2 are substantially symmetrical with respect to the second direction D2 and asymmetrical with respect to the first direction D1, i.e., they have an axis of symmetry along the second direction D2 and asymmetrical with respect to a direction perpendicular to that axis of symmetry. The substantially axisymmetric third sub-pixels 103 may reduce the complexity of the pattern of the mask used for the evaporation process of the pixel arrangement 100.

In this example, the third sub-pixels 103 each have a strip shape. Specifically, the third sub-pixels 103 in the first groups G1 each extend along the first direction D1, and the third sub-pixels 103 in the second groups G2 each extend along the second direction D2. Such strip-shaped third sub-pixels 103 allow an increase in the area of the second sub-pixels 102. In the case of an increased area, the second sub-pixels 102 may advantageously serve as sub-pixels that are less efficient in illumination, for example, blue sub-pixels.

The third sub-pixels 103 each further have two ends of different outlines. Specifically, one of the two ends has a circular arc-shaped outline, and the other of the two ends has an outline formed by at least one straight line (a trapezoid in the example of FIG. 2). This allows for a flexible design of the sub-pixel pattern, as will be described in more detail later.

In this example, the third sub-pixels 103 in the first groups G1 have substantially the same orientation, and the third sub-pixels 103 in the third groups G3 also have substantially the same orientation. As shown in FIG. 2, the circular arc-shaped ends of the third sub-pixels 103 in the first group G1 all point to the upper right corner of the figure, and the circular arc-shaped ends of the third sub-pixels 103 in the third group G3 point to the lower right corner of the figure. This provides a specific sub-pixel pattern.

FIG. 2 further shows a large rectangle (hereinafter referred to as "first imaginary rectangle") defined by the dashed line connecting the first sub-pixels 101 at the four corners. The first imaginary rectangle includes four small rectangles (hereinafter referred to as "second imaginary rectangles"), each of which is defined by a respective vertex of four vertices of the first imaginary rectangle, respective centers of two adjoining ones, which contain that respective vertex, of four sides of the first imaginary rectangle, and a center of the first imaginary rectangle. The pixel arrangement of FIG. 2 is described below with reference to the first imaginary rectangle and the second imaginary rectangle.

The pixel arrangement includes five first sub-pixels 101 respectively located at the center and the four vertices of the first imaginary rectangle, four second sub-pixels 102 located at respective centers of the four sides of the first imaginary rectangle, and four third sub-pixels 103 located within respective ones of the four second imaginary rectangles. It will be understood that the phrase "a sub-pixel located at a position" means that the sub-pixel overlaps the position without necessarily requiring the center of the sub-pixel to overlap that position. The center of the sub-pixel may be the geometric center of the sub-pixel or the center of a light-emitting zone of the sub-pixel.

Figure 3:
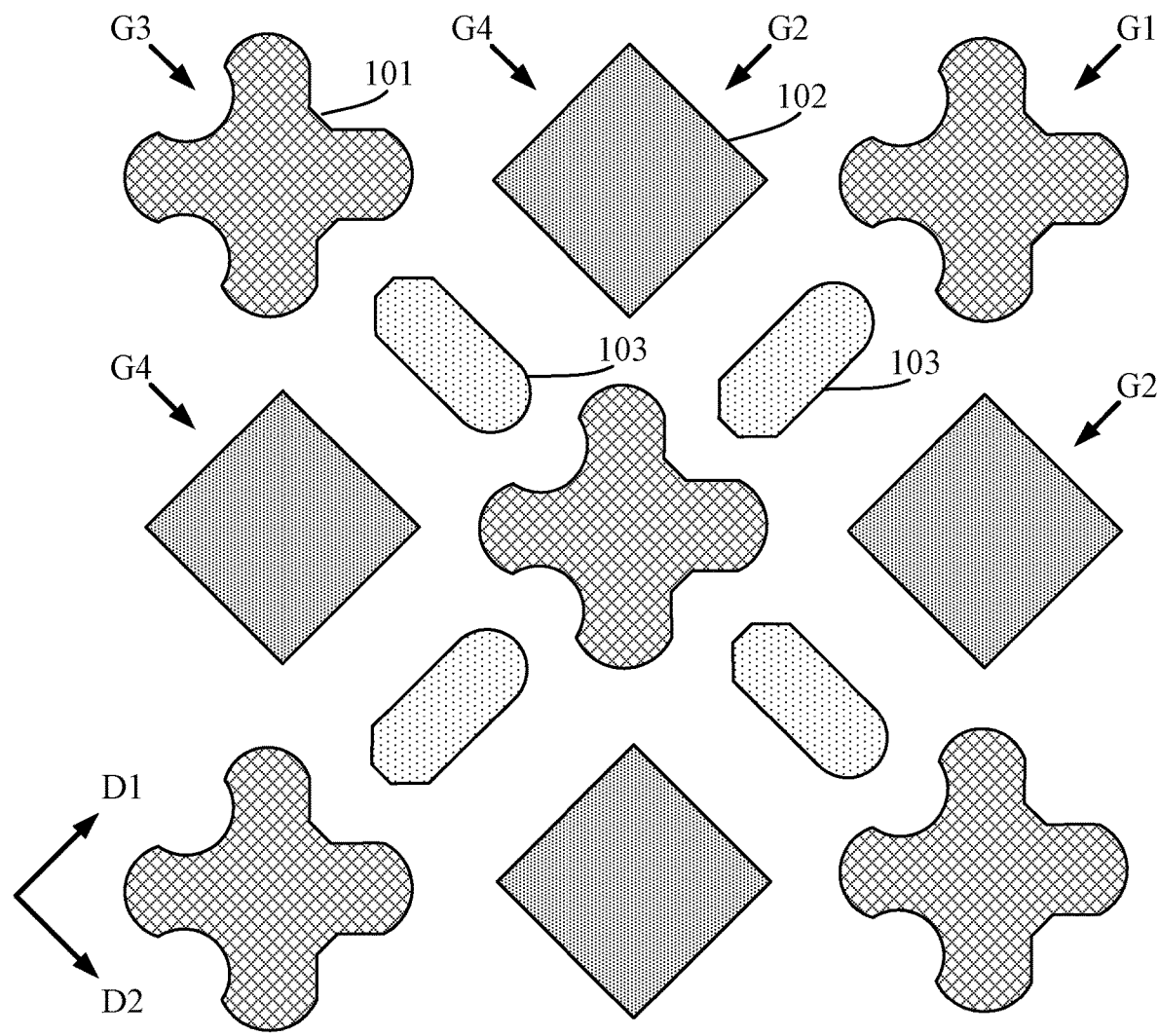
FIG. 3 is a schematic plan view of a partial area of a variation of the pixel arrangement of FIG. 1.

FIG. 3 is a schematic plan view of a partial area of a variation of the pixel arrangement 100 of FIG. 1.

In contrast to the embodiment of FIG. 2, each of the first sub-pixels 101 has four rounded corners instead of four right-angled corners in this embodiment. This provides a specific sub-pixel pattern.

Figure 4:
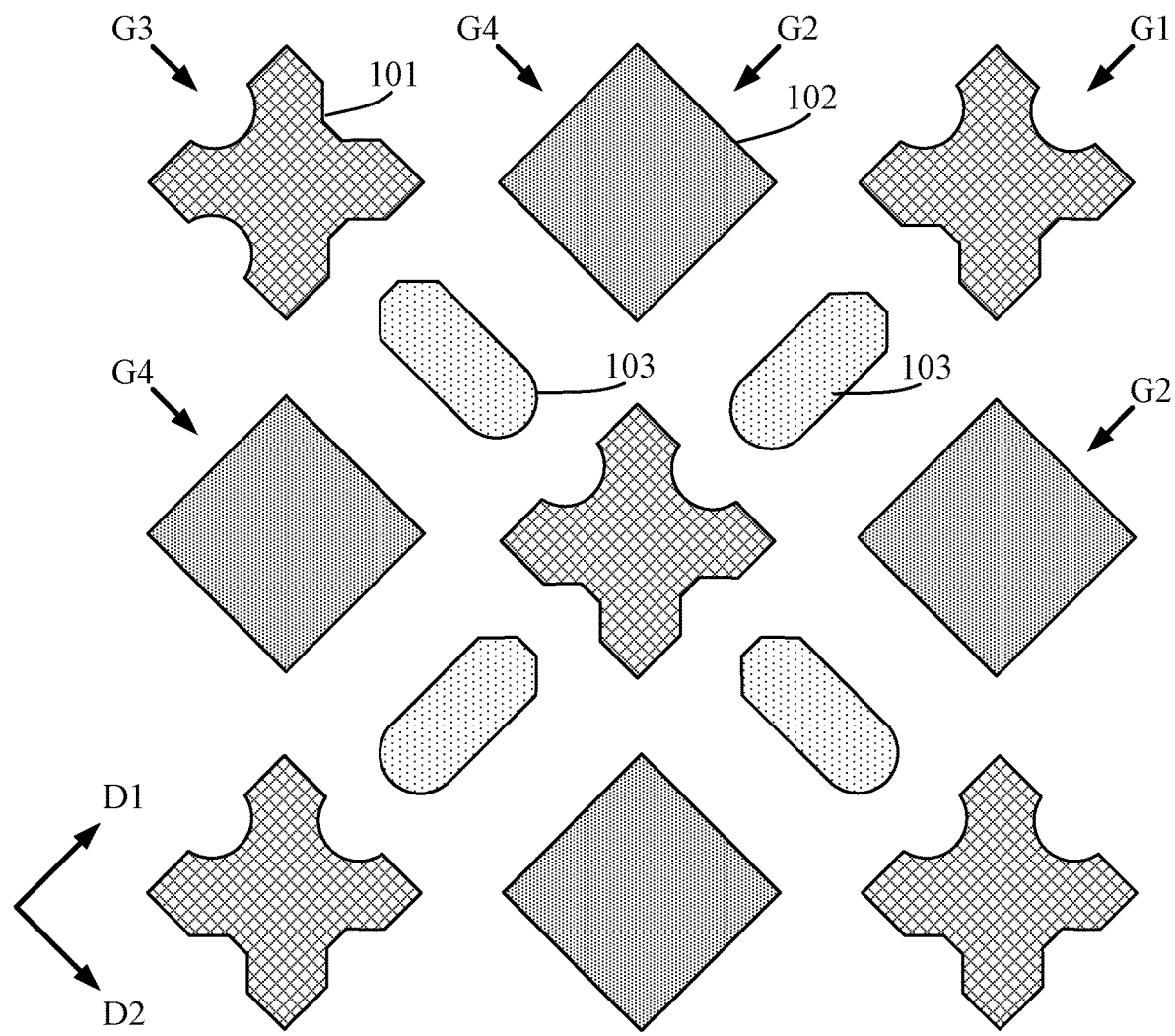
FIG. 4 is a schematic plan view of a partial area of another variation of the pixel arrangement of FIG. 1.

FIG. 4 is a schematic plan view of a partial area of another variation of the pixel arrangement 100 of FIG. 1.

Compared to the embodiment of FIG. 2, the pixel arrangement as a whole is rotated clockwise by 90 degrees in this embodiment. This provides a flexible design of the sub-pixel pattern.

In this embodiment, each of first ones of the first sub-pixels 101 has four sides respectively opposite to four corresponding ones, directly adjacent thereto in the first direction D1 and the second direction D2, of the third sub-pixels 103, and each side of the four sides has a respective outline that matches the outline of an end, opposite to that side, of a respective one of the four corresponding third sub-pixels 103.

Figure 5:
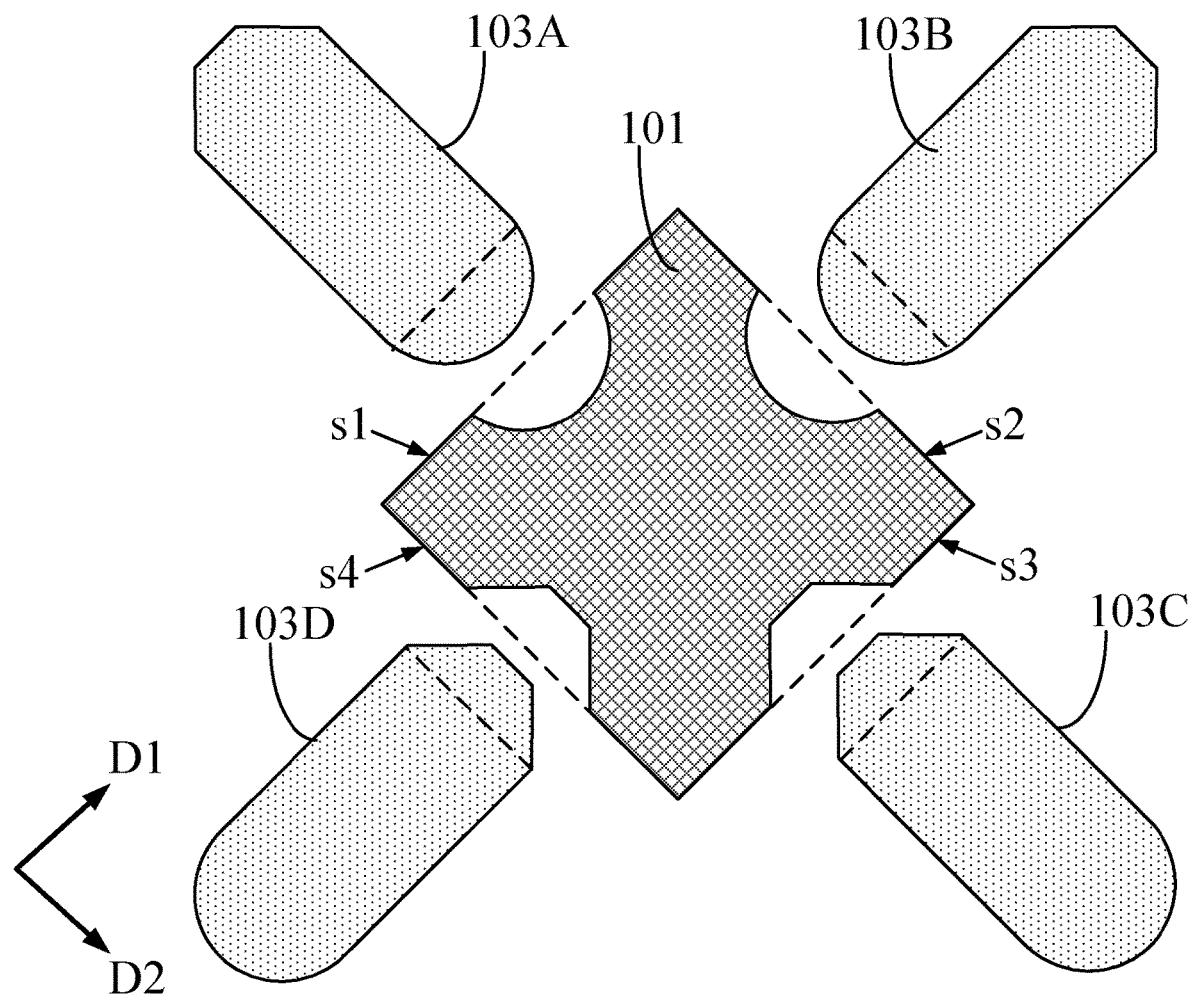
FIG. 5 is a partially enlarged schematic view showing the pixel arrangement of FIG. 4.

This is more clearly shown in FIG. 5, which is a partially enlarged schematic view of the pixel arrangement of FIG. 4 and shows a first sub-pixel 101 and four third sub-pixels 103A, 103B, 103C, and 103D directly adjacent to that first sub-pixel 101 in the first direction D1 and the second direction D2.

As shown in FIG. 5, the first sub-pixel 101 has four edges s1, s2, s3, and s4 opposite to the third sub-pixels 103A, 103B, 103C, and 103D, respectively, and each of the four edges has a respective outline that matches the outline of an end, opposite to that edge, of a respective one of the third sub-pixels 103A, 103B, 103C, and 103D. Specifically, the edge s1 has an outline that matches the circular arc-shaped end of the third sub-pixel 103A, the edge s2 has an outline that matches the circular arc-shaped end of the third sub-pixel 103B, the edge s3 has an outline that matches the trapezoidal end of the third sub-pixel 103C, and the edge s4 has an outline that matches the trapezoidal end of the third sub-pixel 103D. More specifically, the four edges s1, s2, s3, and s4 have respective recessed portions having substantially the same shapes as the corresponding ends of the strip-shaped third sub-pixels 103A, 103B, 103C, and 103D. This allows for a closer arrangement of the first sub-pixels 101 with the third sub-pixels 103A, 103B, 103C, and 103D, thereby providing the required sub-pixel area while avoiding color mixing.

In this embodiment, the first sub-pixel 101 and the third sub-pixels 103A, 103B, 103C, and 103D each have no internal angle of less than 90 degrees. The larger the internal angle of the sub-pixel, the easier the evaporation process is achieved. Instead, if the internal angle of the sub-pixel is relatively small, it may be necessary to compensate for the pattern of the mask. Consequently, the sub-pixel pattern according to the present embodiment may reduce the complexity of the pattern of the mask.

In addition, due to the matching outlines of the first sub-pixel 101 and the third sub-pixels 103C and 103D, the third sub-pixel 103C has a side opposite and substantially parallel to a side of the first sub-pixel 101, and the third sub-pixel 103D has a side opposite and substantially parallel to a side of the first sub-pixel 101. Specifically, the recessed portion of the edge s3 is parallel to the outline of the trapezoidal end of the third sub-pixel 103C, and the recessed portion of the edge s4 is parallel to the outline of the trapezoidal end of the third sub-pixel 103D. Although not shown in FIG. 5, in an alternative embodiment, the recessed portions of the edges s1 and s2 may have such a curvature that these two recessed portions are respectively parallel with the circular arc-shaped ends of the third sub-pixels 103A and 103B.

Referring back to FIG. 4, each of the third sub-pixels 103 in the second groups of sub-pixels G2 has a side opposite and substantially parallel to a side of the second sub-pixel 102 directly adjacent in the first direction D1, and each of the third sub-pixels 103 in the fourth groups of sub-pixels G4 has a side opposite and substantially parallel to a side of the second sub-pixel 102 directly adjacent in the second direction D2. This provides a uniform width of the gap between a third sub-pixel 103 and a directly adjacent second sub-pixel 102, which is advantageous for preventing color mixing.

Moreover, since the opposite sides of the third sub-pixel 103 and the directly adjacent second sub-pixel 102 are straight line shaped, the complexity of the pattern of the mask can be simplified. The present disclosure is not limited thereto. For example, the opposite sides of the third sub-pixel 103 and the directly adjacent second sub-pixel 102 may not be straight line shaped.

Figure 6:
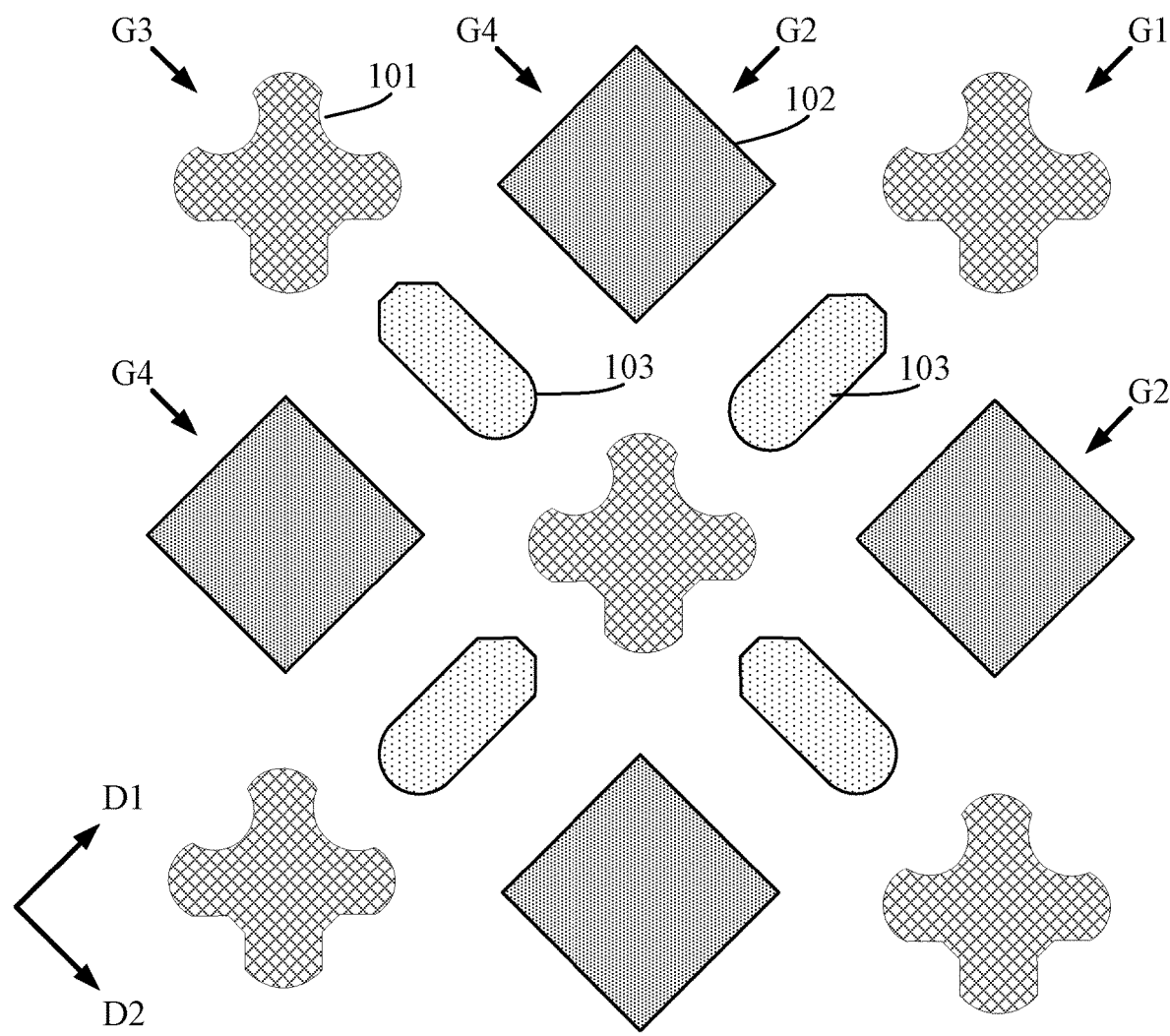
FIG. 6 is a schematic plan view of a partial area of another variation of the pixel arrangement of FIG. 1.

FIG. 6 is a schematic plan view of a partial area of a variation of the pixel arrangement 100 of FIG. 1.

In contrast to the embodiment of FIG. 4, each of the first sub-pixels 101 has four rounded corners instead of four right-angled corners in this embodiment. This provides a specific sub-pixel pattern.

Figure 7:
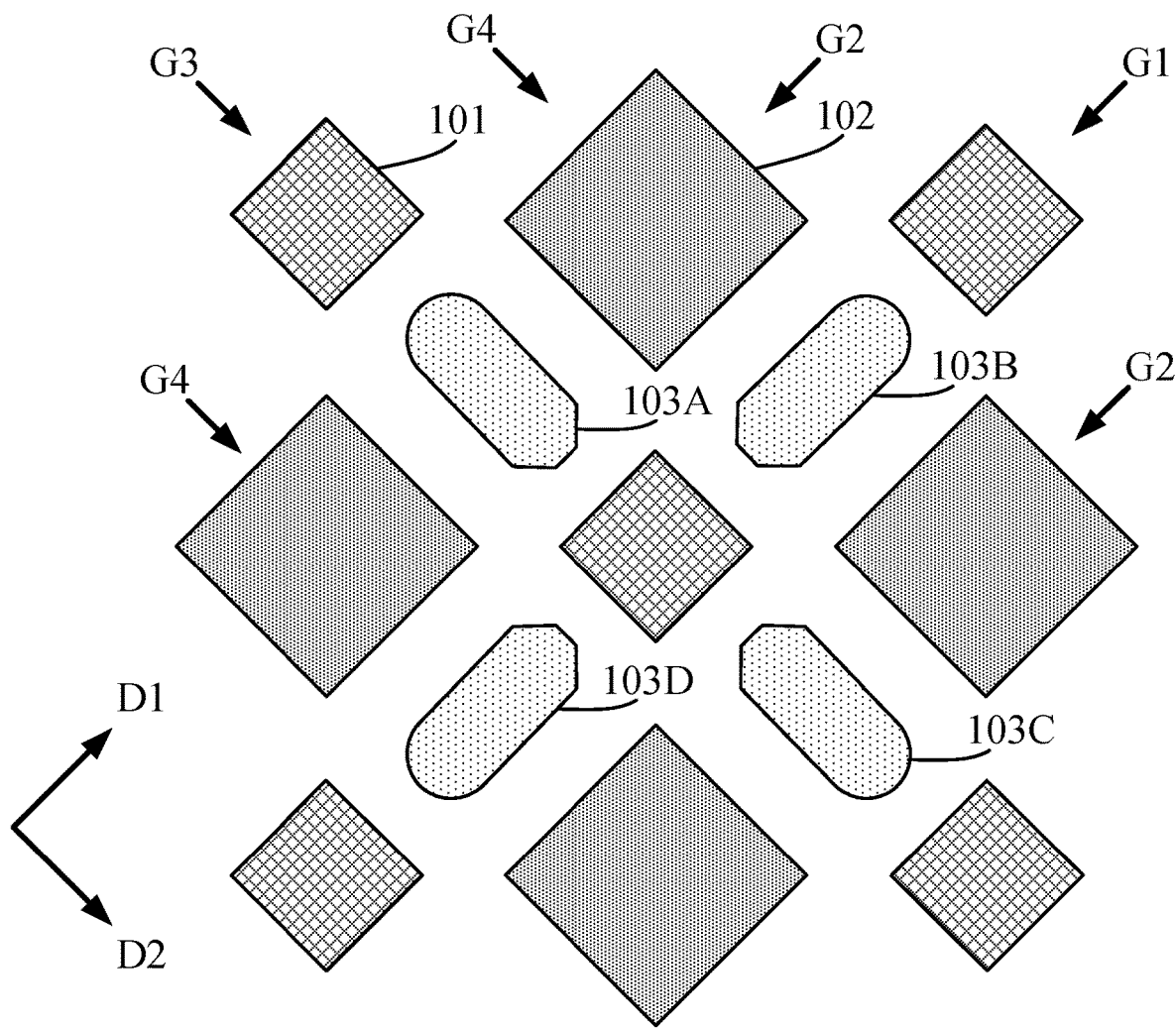
FIG. 7 is a schematic plan view of a partial area of another variation of the pixel arrangement of FIG. 1.

FIG. 7 is a schematic plan view of a partial area of another variation of the pixel arrangement 100 of FIG. 1.

Unlike the embodiments described above, each of the first sub-pixels 101 has a rectangular shape in this embodiment, thereby simplifying the complexity of the pattern of the mask.

In this embodiment, each two adjacent ones of the third sub-pixels 103 in each first group G1 have respective orientations substantially opposite to each other. As shown in FIG. 7, the third sub-pixels 103B and 103D have orientations substantially opposite to each other, wherein the circular arc-shaped end of the third sub-pixel 103B points to the upper right corner of the figure and the circular arc-shaped end of the third sub-pixel 103D points to the bottom left corner of the figure.

In this embodiment, each two adjacent ones of the third sub-pixels 103 in each third group G3 have respective orientations substantially opposite to each other. As shown in FIG. 7, the third sub-pixels 103A and 103C have orientations substantially opposite to each other, wherein the circular arc-shaped end of the third sub-pixel 103A points to the upper left corner of the figure and the circular arc-shaped end of the third sub-pixel 103C points to the bottom right corner of the figure. This provides a flexible design of the sub-pixel pattern.

Figure 8:
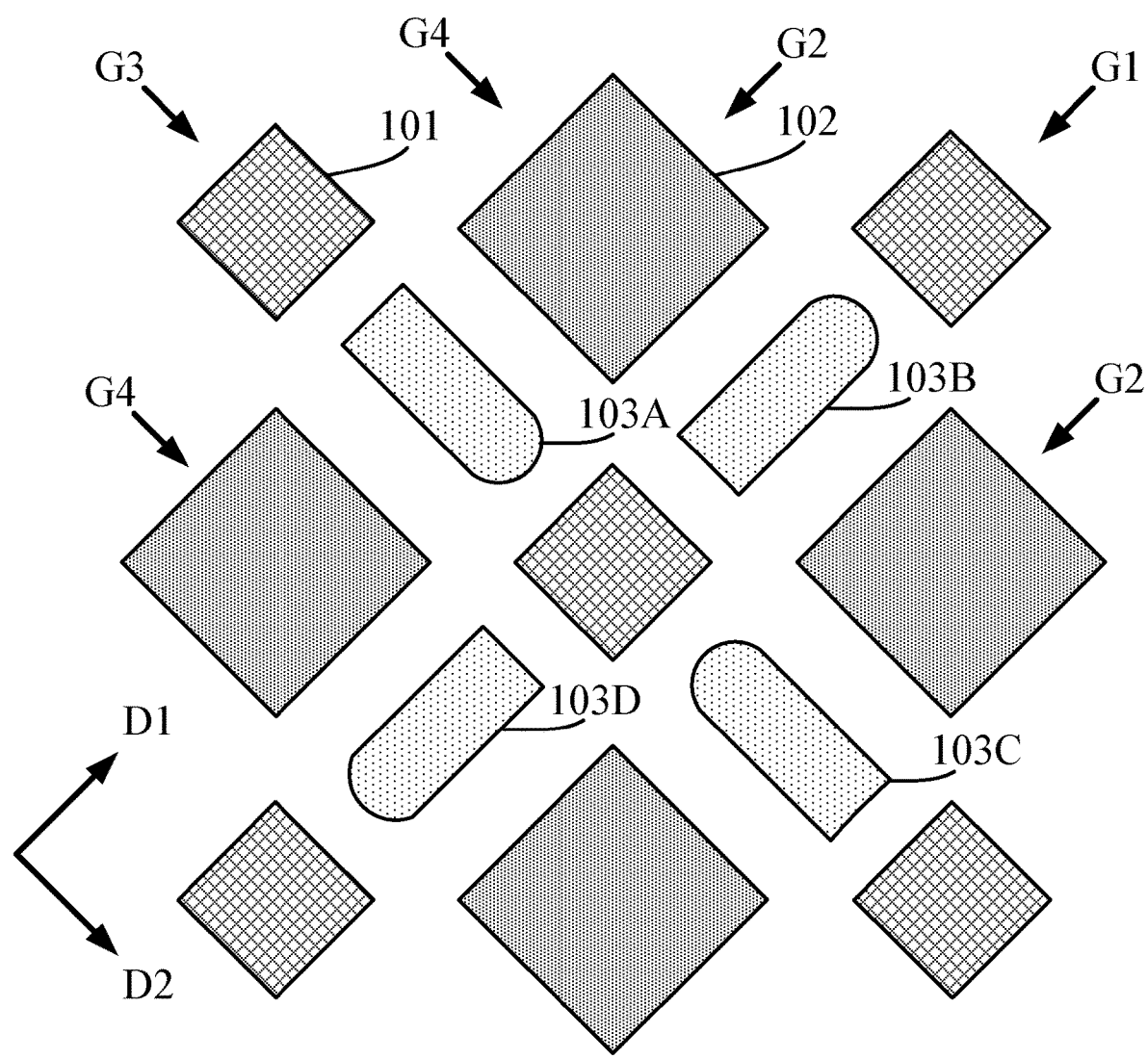
FIG. 8 is a schematic plan view of a partial area of another variation of the pixel arrangement of FIG. 1.

FIG. 8 is a schematic plan view of a partial area of another variation of the pixel arrangement 100 of FIG. 1.

In this embodiment, the third sub-pixels 103 have different shapes than those in the embodiment of FIG. 7. As shown in FIG. 8, the third sub-pixels 103A, 103B, 103C, and 103D are each still strip-shaped, but have one end of a circular arc-shaped outline and another end of a flat outline. This simplifies the complexity of the pattern of the mask.

Although various variations of the first sub-pixels 101, the second sub-pixels 102, and the third sub-pixels 103 are described above in connection with FIGS. 1-8, the present disclosure is not limited thereto. For example, the first sub-pixels 101 and the second sub-pixels 102 may have at least one shape selected from the group consisting of a rectangle, an ellipse, a convex polygon, a concave polygon, a triangle, and a circle, and the third sub-pixels 103 may have different shapes than those illustrated. Other embodiments are possible. The third sub-pixels 103 may or may not have substantially the same area and substantially the same shape, the first sub-pixels 101 may or may not have substantially the same area and substantially the same shape, and the second sub-pixels 102 may or may not have substantially the same area and substantially the same shape. In practice, the shape, orientation, and relative position of the first sub-pixels 101, the second sub-pixels 102, and the third sub-pixels 103 can be designed as needed.

In the embodiments described above, the third sub-pixels 103 may be green sub-pixels. In some embodiments, the first sub-pixels 101 may be red sub-pixels and the second sub-pixels 102 may be blue sub-pixels. Alternatively, the first sub-pixels 101 may be blue sub-pixels, and the second sub-pixels 102 may be red sub-pixels. Since the human eye is more sensitive to green light, the area of the third sub-pixel 103 may be relatively small. In some embodiments, the area of the green sub-pixel is smaller than the area of the red sub-pixel, and the area of the red sub-pixel is smaller than the area of the blue sub-pixel. Alternatively, the area of the red sub-pixel is smaller than the area of the green sub-pixel, and the area of the green sub-pixel is smaller than the area of the blue sub-pixel. The red sub-pixels have a first total area, the green sub-pixels have a second total area, and the blue sub-pixels have a third total area. In some embodiments, the first total area, the second total area, and the third total area have a ratio of 1:(1.1-1.5):(1.2-1.7), further 1:(1.21.35):(1.4 to 1.55), or further 1:1.27:1.46. This provides different levels of visual quality improvement compared to pixel patterns in which the red, green, and blue sub-pixels have the same total area. In some embodiments, the ratio of the red sub-pixels, the green sub-pixels, and the blue sub-pixels in quantity is approximately 1:2:1. This can be achieved by sufficiently extending the pattern of the pixel arrangement in both the first direction D1 and the second direction D2. The term "approximately" is intended to cover a certain range of error, such as ±10% (based on the number of the red or blue sub-pixels). For example, 1:1.9:1 is considered to be "approximately 1:2:1".

It will be understood that in the embodiments described above, the distance between any two of the first sub-pixels 101, the second sub-pixels 102, and the third sub-pixels 103 has to be greater than or equal to a process limit distance. Here, a distance between two sub-pixels is defined as the shortest one of the distances between points of one of the two sub-pixels and points of the other of the two sub-pixels. The process limit distance is related to the manufacturing process used. In embodiments in which a fine metal mask (FMM) is used in conjunction with an etching process, the process limit distance is about 16 µm. In embodiments where processes such as lasering or electroforming are used, the process limit distance would be even smaller. In some embodiments, the distance between the third sub-pixel 103 and the first sub-pixel 101 is equal to the distance between the third sub-pixel 103 and the second sub-pixel 102.

Figure 9:
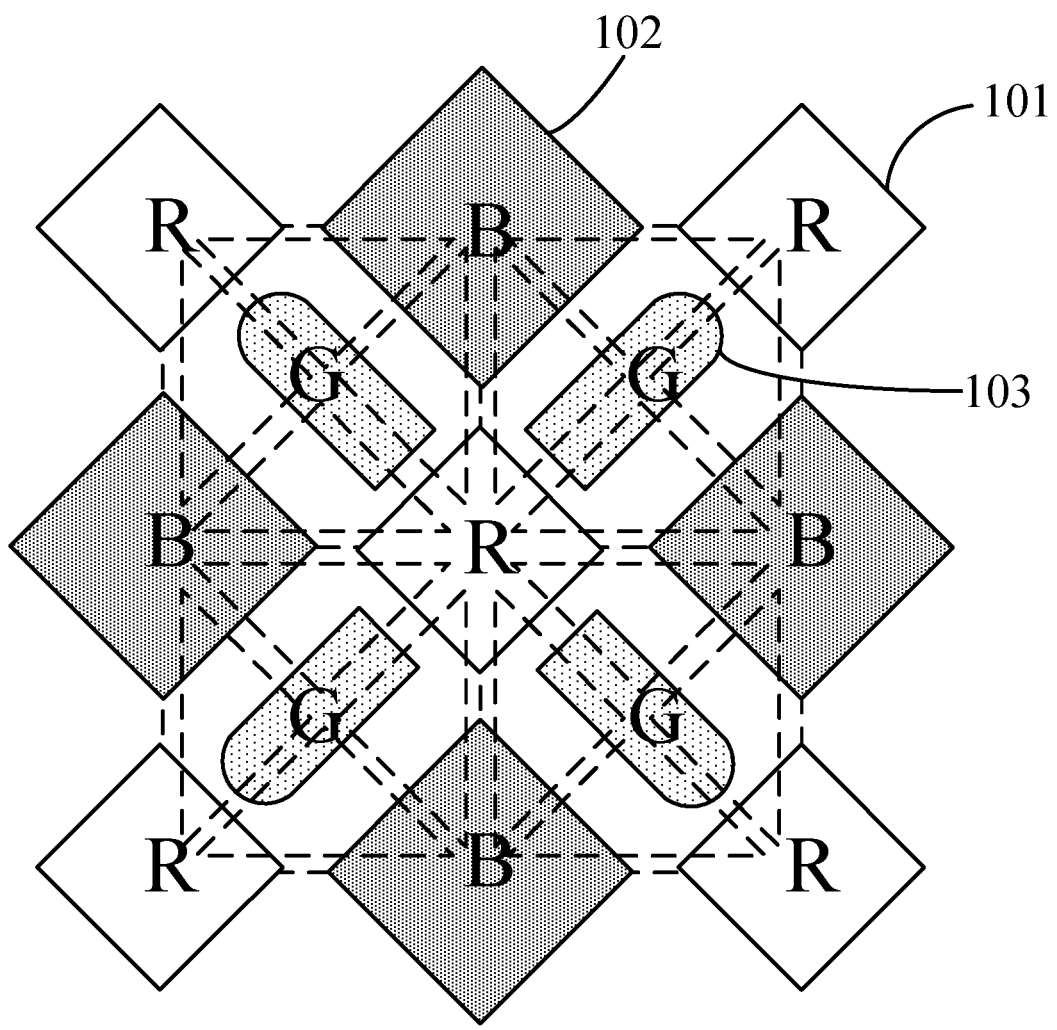
FIG. 9 is a schematic view generally showing a principle of color-borrowing of a pixel arrangement according to an embodiment of the present disclosure.

FIG. 9 generally illustrates the principle of color-borrowing of a pixel arrangement in accordance with an embodiment of the present disclosure.

In this example, the first sub-pixels 101 are red sub-pixels, the second sub-pixels 102 are blue sub-pixels, and the third sub-pixels 103 are green sub-pixels. The area of the second sub-pixel 102 is the same as the area of the first sub-pixel 101, that is, the area of the red sub-pixel is the same as the area of the blue sub-pixel.

As shown in FIG. 9, the green sub-pixel G, the red sub-pixel R, and the blue sub-pixel B located at the vertices of each dashed-line triangle form a respective virtual pixel. Advantageously, there are always common sub-pixels between directly adjacent dashed-line triangles. This provides a higher virtual resolution than the physical resolution, improving the display effect. Furthermore, as described above, the first sub-pixels 101, the second sub-pixels 102, and the third sub-pixels 103 are allowed to be arranged more closely, thereby providing a larger area per sub-pixel than the existing pixel arrangement.

Figure 10:
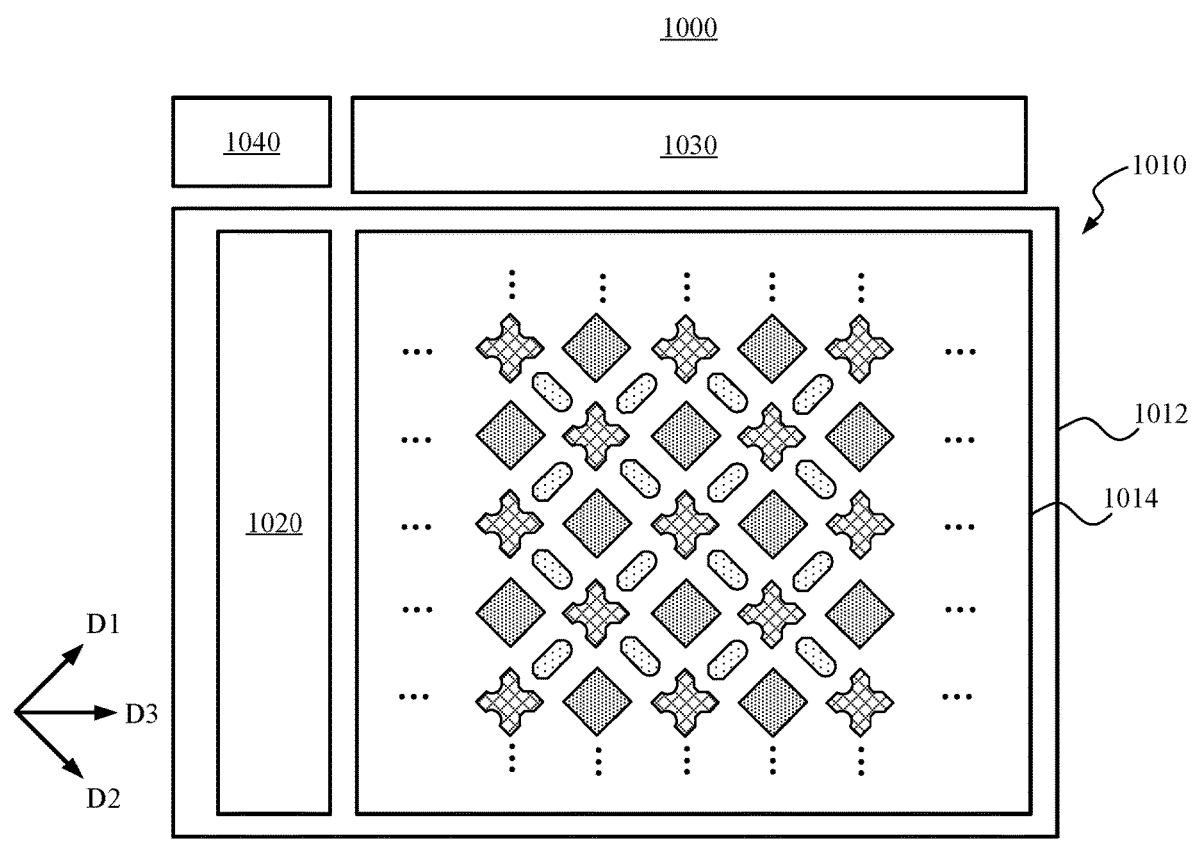
FIG. 10 is a schematic plan view of a display device according to an embodiment of the present disclosure.

FIG. 10 is a schematic plan view of a display device 1000 in accordance with an embodiment of the present disclosure.

Referring to FIG. 10, the display device 1000 includes a display panel 1010, a scan driver 1020, a data driver 1030, and a timing controller 1040.

The display panel 1010 includes a display substrate 1012 and a pixel arrangement 1014 formed on the display substrate 1012. The pixel arrangement 1014 may take the form of any of the pixel arrangement 100 and various variations thereof described above with respect to FIGS. 1-9. The pixel arrangement 1014 is arranged such that each of the first direction D1 and the second direction D2 (according to which the configurations of the pixel arrangement 100 and its various variations have been described) intersects a length direction D3 of the display substrate 1012 at approximately 45 degrees. The term "approximately" is intended to cover a certain range of error, such as ±10%. For example, 40.5 degrees is considered to be "approximately 45 degrees." The sub-pixels in the pixel arrangement 1014 may be organic electroluminescence sub-pixels, although the disclosure is not limited thereto.

From the perspective of the first imaginary rectangle, the pixel arrangement 1014 includes a plurality of adjoining first imaginary rectangles. In the row direction (the horizontal direction in FIG. 10), each two directly adjacent ones of the first imaginary rectangles have a common side such that the sub-pixels on the common side are shared by those two directly adjacent first imaginary rectangles. In the column direction (the vertical direction in FIG. 10), each two directly adjacent ones of the first imaginary rectangles have a common side such that the sub-pixels on the common side are shared by those two directly adjacent first imaginary rectangles.

The scan driver 1020 outputs gate scan signals to the display panel 1010. In some exemplary embodiments, the scan driver 1020 may be directly integrated in the display substrate 1012 as a gate-driver-on-array (GOA) circuit. Alternatively, the scan driver 1020 may be connected to the display panel 1010 by a Tape Carrier Package (TCP). The implementation of the scan driver 1020 may be known, and a detailed description thereof is thus omitted.

The data driver 1030 outputs data voltages to the display panel 1010. In some embodiments, the data driver 1030 may include a plurality of data driving chips that operate in parallel. The implementation of the data driver 1030 may be known, and a detailed description thereof is thus omitted.

The timing controller 1040 controls the operations of the scan driver 1020 and the data driver 1030. Specifically, the timing controller 1040 outputs data control signals and image data to control the driving operation of the data driver 1030, and outputs gate control signals to control the driving operation of the scan driver 1020. The data control signals and the image data are applied to the data driver 1030. The gate control signals are applied to the scan driver 1020. The implementation of the timing controller 1040 may be known, and a detailed description thereof is thus omitted.

The display device 1000 has the same advantages as the pixel arrangement embodiments described above with respect to FIGS. 1-9, which will not be repeated herein. By way of example and not limitation, the display device 1000 can be any product or component having a display function, such as a cell phone, a tablet computer, a television set, a display, a notebook computer, a digital photo frame, a navigator, and the like.

Figure 11A:
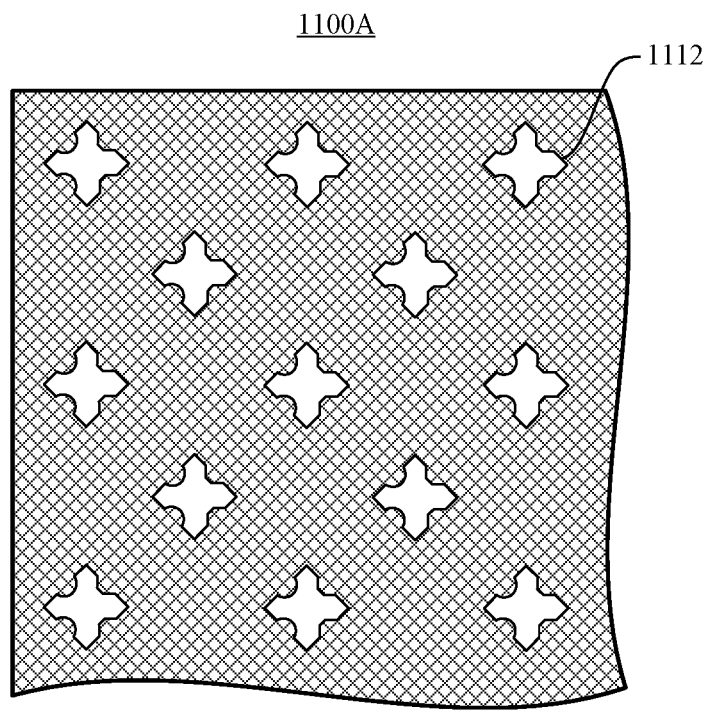
FIGS. 11A, 11B, and 11C are schematic plan views of a set of masks according to an embodiment of the present disclosure.
Figure 11B:
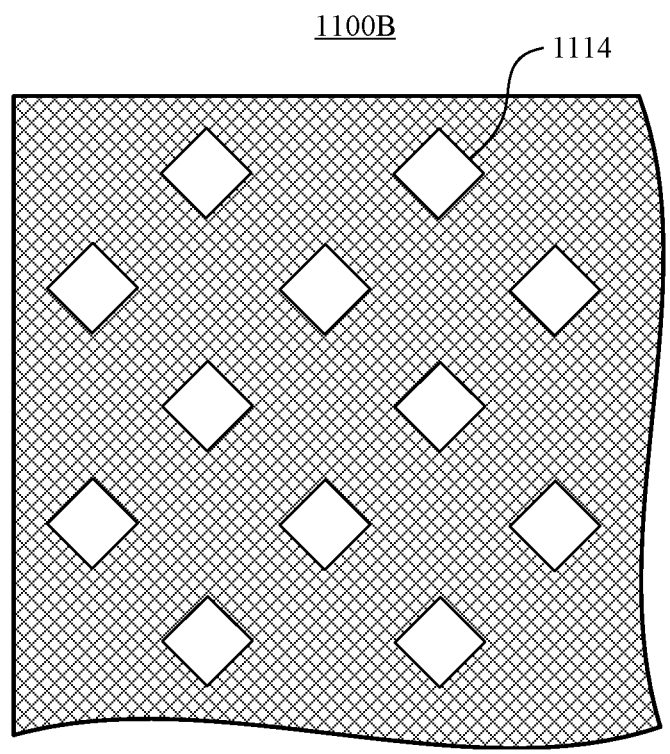
Figure 11C:
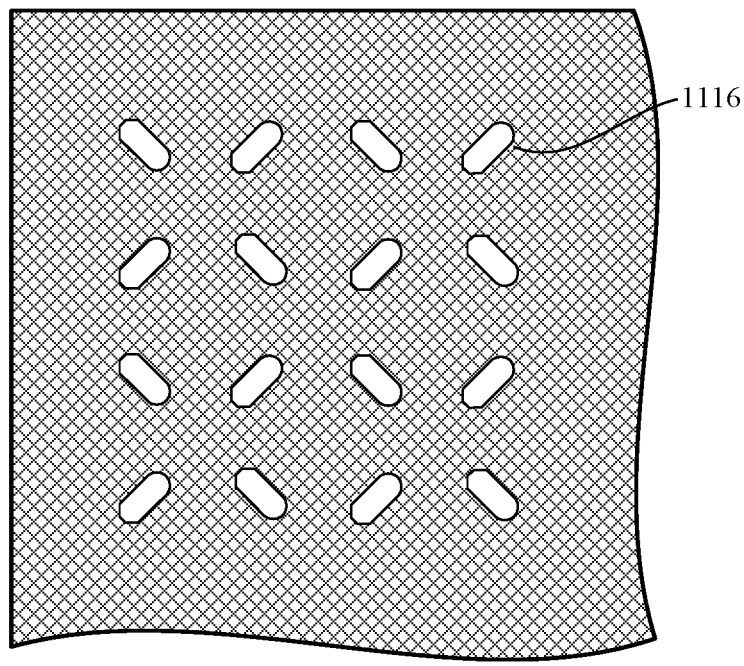

FIGS. 11A, 11B, and 11C are schematic plan views of a set of masks in accordance with an embodiment of the present disclosure. The set of masks includes a first mask 1100A, a second mask 1100B, and a third mask 1100C.

Referring to FIG. 11A, only a part of the first mask 1100A is shown. The first mask 1100A defines a plurality of first openings 1112. The plurality of first openings 1112 are arranged to have a pattern corresponding to the pattern of the first sub-pixels of any of the pixel arrangement 100 and various variations thereof described above with respect to FIGS. 1-9. In this example, the plurality of first openings 1112 are arranged to have a pattern corresponding to the pattern of the first sub-pixels of the pixel arrangement 100 of FIG. 1. In some embodiments, the mask 1100A is a fine metal mask that can be used in an evaporation process to form a desired pixel pattern.

Referring to FIG. 11B, only a part of the second mask 1100B is shown. The second mask 1100B defines a plurality of second openings 1114. The plurality of second openings 1114 are arranged to have a pattern corresponding to the pattern of the second sub-pixels of any of the pixel arrangement 100 and various variations thereof described above with respect to FIGS. 1-9. In this example, the plurality of second openings 1114 are arranged to have a pattern corresponding to the pattern of the second sub-pixels of the pixel arrangement 100 of FIG. 1. In some embodiments, the mask 1100B is a fine metal mask that can be used in an evaporation process to form a desired pixel pattern.

Referring to FIG. 11C, only a part of the third mask 1100C is shown. The third mask 1100C defines a plurality of third openings 1116. The plurality of third openings 1116 are arranged to have a pattern corresponding to the pattern of the third sub-pixels of any of the pixel arrangement 100 and various variations thereof described above with respect to FIGS. 1-9. In this example, the plurality of third openings 1116 are arranged to have a pattern corresponding to the pattern of the third sub-pixels of the pixel arrangement 100 of FIG. 1. In some embodiments, the mask 1100C is a fine metal mask that can be used in an evaporation process to form a desired pixel pattern.

The masks 1100A, 1100B, and 1100C may provide the same advantages as the pixel arrangement embodiments described above with respect to FIGS. 1-9, which are not repeated herein.

Figure 12:
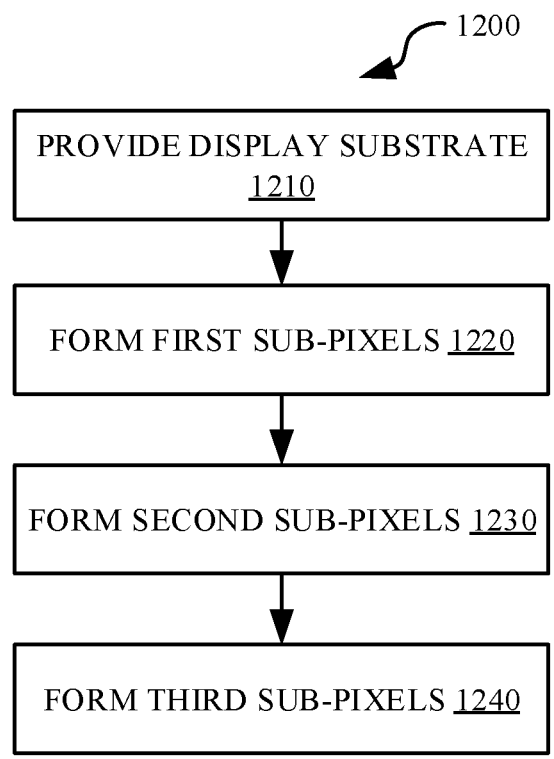
FIG. 12 is a flow chart of a method of manufacturing a pixel arrangement in accordance with an embodiment of the present disclosure.

FIG. 12 is a flow chart of a method 1200 of manufacturing a pixel arrangement in accordance with an embodiment of the present disclosure. The pixel arrangement embodiments described above with respect to FIGS. 1-9 can be implemented using the method 1200 and the masks 1100A, 1100B, and 1100C.

Referring to FIG. 12, at step 1210, a display substrate is provided. The display substrate is typically a back-plate that has been provided with driving circuits formed of, for example, thin film transistor (TFTs). At step 1220, a first electroluminescent material is evaporated and the evaporated first electroluminescence material is deposited onto the display substrate to form the first sub-pixels 101 by passing the evaporated first electroluminescent material through the plurality of first openings 1112 of the first mask 1100A. At step 1230, a second electroluminescent material is evaporated and the evaporated second electroluminescence is deposited onto the display substrate to form the second sub-pixels 102 by passing the evaporated second electroluminescent material through the plurality of second openings 1114 of the second mask 1100B. At step 1240, a third electroluminescent material is evaporated and the evaporated third electroluminescence is deposited onto the display substrate to form the third sub-pixels 103 by passing the evaporated third electroluminescent material through the plurality of third openings 1116 of the third mask 1100C. Steps 1220 to 1240 are generally referred to as evaporation, whereby the pixel pattern can be formed at predetermined positions on the display substrate. It will be understood that steps 1220 to 1240 can be performed in an order different from that illustrated and described. In some embodiments, the electroluminescent materials may be organic electroluminescent materials. Other electroluminescent materials are possible.

Variations to the disclosed embodiments can be understood and effected by the skilled person in practicing the claimed subject matter, from a study of the drawings, the disclosure, and the appended claims. While operations are depicted in the drawings in a particular order, this should not be understood as requiring that such operations are to be performed in the particular order shown or in a sequential order, or that all illustrated operations are to be performed to achieve desirable results. In the claims, the word "comprises" or "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A pixel arrangement, comprising:
a plurality of first groups of sub-pixels arranged in a first direction, each of the plurality of first groups comprising a plurality of first sub-pixels and a plurality of third sub-pixels arranged alternately; and
a plurality of second groups of sub-pixels arranged in the first direction, each of the plurality of second groups comprising a plurality of third sub-pixels and a plurality of second sub-pixels arranged alternately;
wherein the plurality of first groups and the plurality of second groups are alternately arranged in a second direction perpendicular to the first direction;
wherein the plurality of first groups and the plurality of second groups are arranged to form a plurality of third groups of sub-pixels arranged in the second direction and a plurality of fourth groups of sub-pixels arranged in the second direction, the plurality of third groups and the plurality of fourth groups are alternately arranged in the first direction, each of the plurality of third groups comprises a plurality of first sub-pixels and a plurality of third sub-pixels arranged alternately, and each of the plurality of fourth groups comprises a plurality of third sub-pixels and a plurality of second sub-pixels arranged alternately;
wherein at least one of the third sub-pixels has a shape that protrudes toward at least one adjacent sub-pixel of the adjacent sub-pixels in at least one of the first direction and the second direction, and the at least one adjacent sub-pixel has a concave shape;
wherein at least one of the first sub-pixels has four edges respectively opposite to four directly adjacent third sub-pixels in the first and second directions, respectively, and each edge of the four edges has a respective outline that matches an outline of an end, opposite to the edge, of a respective one of the four directly adjacent third sub-pixels;
wherein each of the third sub-pixels and an adjacent sub-pixel selected from the group consisting of the adjacent first and second sub-pixels of said each third sub-pixel have the same symmetry axis, and the symmetry axis extends along one of the first direction and the second direction.

2. The pixel arrangement of claim 1, wherein the protruded shape can be one of a trapezoid and an arc.

3. The pixel arrangement of claim 1, wherein at least one third sub pixel of the third sub pixels has an equal distance from two adjacent sub-pixels of the same color in the at least one direction.

4. The pixel arrangement of claim 1, wherein two sub-pixels of the same color adjacent to at least one third sub-pixel of the third sub pixels in the at least one direction have a concave shape towards the at least one third sub-pixel.

5. The pixel arrangement of claim 1, wherein each of the third sub-pixels has a strip shape.

6. The pixel arrangement of claim 5,
wherein the third sub-pixels in each of the plurality of first groups each extend along the first direction, and
wherein the third sub-pixels in each of the plurality of second groups each extend along the second direction.

7. The pixel arrangement of claim 1, wherein at least one of the third sub-pixels has an axisymmetric shape, and the symmetry axis of the axisymmetric shape includes at least one of the first direction and the second direction.

8. The pixel arrangement of claim 1, wherein at least one of the second sub-pixels has an axisymmetric shape, and the symmetry axis of the axisymmetric shape includes at least one of a row direction and a column direction, and the row direction and the column direction are different from the first direction and the second direction.

9. The pixel arrangement of claim 1, wherein at least one of the first sub-pixels has an axisymmetric shape, and the symmetry axis of the axisymmetric shape includes at least one of a row direction or a column direction, and the row direction and the column direction are different from the first direction and the second direction.

10. The pixel arrangement of claim 1, wherein,
at least one symmetry axis of at least one second sub-pixel of the second sub-pixels is not the symmetry axis of a third sub-pixel adjacent to said at least one second sub-pixel; and/or,
at least one symmetry axis of at least one first sub-pixel of the first sub-pixels is not the symmetry axis of a third sub-pixel adjacent to said at least one first sub-pixel.

11. The pixel arrangement of claim 1, wherein the two third sub-pixels directly adjacent in at least one of the first direction and the second direction are mirror symmetrical.

12. The pixel arrangement of claim 1, wherein a ratio of the maximum distance to the minimum distance from a side of each third sub-pixel of the third sub-pixels to the side of the adjacent first sub-pixel opposite to the side of the each third sub-pixel ranges from 1 to 1.5;
a ratio of the maximum distance to the minimum distance from a side of each third sub-pixel of the third sub-pixels to the side of the adjacent second sub-pixel opposite to the side of the each third sub-pixel ranges from 1 to 1.5.

13. The pixel arrangement structure according to claim 1, wherein the shape of at least one of the first sub-pixels and the third sub-pixels includes a shape formed by making four sides of a square concave in the middle, and the four top corners of the square serve as four ends respectively.

14. The pixel arrangement of claim 1,
wherein a side of at least one of the third sub-pixels in the plurality of first groups of sub-pixels is parallel to an opposite side of a directly adjacent first sub-pixel in the first direction,
wherein a side of at least one of the third sub-pixels in the plurality of second groups of sub-pixels is parallel to an opposite side of a directly adjacent second sub-pixel in the first direction,
wherein a side of at least one of the third sub-pixels in the plurality of third groups of sub-pixels is parallel to an opposite side of a directly adjacent first sub-pixel in the second direction, and
wherein a side of at least one of the third sub-pixels in the plurality of fourth groups of sub-pixels is parallel to an opposite side of a directly adjacent second sub-pixel in the second direction.

15. The pixel arrangement of claim 1, wherein each of the first sub-pixels is one of a red pixel and a blue pixel, each of the second sub-pixels is the other of a red pixel and a blue pixel, and wherein each of the third sub-pixels is a green pixel.

16. The pixel arrangement of claim 15,
wherein the blue sub-pixels each have a first area, the red sub-pixels each have a second area smaller than the first area, and the green sub-pixels each have a third area smaller than the second area; or,
wherein the blue sub-pixels each have a first area, the green sub-pixels each have a second area smaller than the first area, and the red sub-pixels each have a third area smaller than the second area.

17. The pixel arrangement of claim 15,
wherein the red sub-pixels have a first total area, the green sub-pixels have a second total area, and the blue sub-pixels have a third total area, and
wherein the first total area, the second total area, and the third total area have a ratio of 1:(1.1 to 1.5):(1.2 to 1.7).

18. A display device comprising the pixel arrangement of claim 1.

19. A display device, comprising:
a display substrate; and
the pixel arrangement of claim 1, wherein the pixel arrangement is formed on the display substrate,
wherein the pixel arrangement is arranged such that each of the first direction and the second direction intersects a length direction of a display area of the display substrate at approximately 45 degrees.

* * * * *